United States Patent
Chotichanon et al.

[11] Patent Number: 5,952,931
[45] Date of Patent: Sep. 14, 1999

[54] CHECKER BOX OF WRIST-STRAP MONITORING

[75] Inventors: Terapat Chotichanon, Nakornratchasima; Prasong Yingprasert, Samutprakarn, both of Thailand

[73] Assignee: Seagate Technology, Inc., Scotts Valley, Calif.

[21] Appl. No.: 09/003,071

[22] Filed: Jan. 5, 1998

Related U.S. Application Data

[60] Provisional application No. 60/034,904, Jan. 7, 1997.

[51] Int. Cl.$^6$ .................................................. G08B 21/00
[52] U.S. Cl. ........................ 340/649; 340/635; 340/573.1; 324/509; 361/212
[58] Field of Search ...................................... 340/649, 650, 340/652, 573.1, 517, 521, 522, 532, 635; 361/212, 220; 324/509, 510

[56] References Cited

U.S. PATENT DOCUMENTS

| | | | |
|---|---|---|---|
| 4,649,374 | 3/1987 | Hoigaard | 340/573 |
| 4,710,751 | 12/1987 | Webster | 340/522 |
| 4,785,294 | 11/1988 | Campbell | 340/649 |
| 4,859,992 | 8/1989 | Hoigaard | 340/649 |
| 5,051,732 | 9/1991 | Robitaille | 340/650 |
| 5,057,965 | 10/1991 | Wilson | 361/212 |
| 5,083,117 | 1/1992 | Hoigaard | 340/649 |
| 5,293,113 | 3/1994 | Beha et al. | 324/72.5 |
| 5,408,186 | 4/1995 | Bakhoum | 324/509 |
| 5,422,630 | 6/1995 | Quinn et al. | 340/661 |
| 5,519,384 | 5/1996 | Chanudet et al. | 340/649 |
| 5,686,897 | 11/1997 | Loh | 340/649 |

*Primary Examiner*—Jeffery A. Hofsass
*Assistant Examiner*—Sihong Huang
*Attorney, Agent, or Firm*—Patrick T. King

[57] ABSTRACT

A wrist-strap monitoring system includes a first wrist-strap monitoring circuitry and a second wrist-strap monitoring circuitry. The first wrist-strap monitoring circuitry is used to monitor continuously impedance of a first human body to be between an upper level and a lower level. The second wrist-strap monitoring circuitry is used to monitor continuously impedance of a second human body to be between the upper level and the lower level. A logic circuit is responsive to the first and second wrist-strap monitoring circuitry for generating an alarm signal. A sound device is responsive to the alarm signal for generating an audible signal. Further, there is provided a ground detection circuit operatively connected to a ground connection for monitoring continuity of the ground connection.

8 Claims, 5 Drawing Sheets

CHECKER BOX OF WRIST-STRAP MONITORING

This application claims the benefit of Provisional Application Ser. No. 60/034,904 filed on Jan. 7, 1997.

BACKGROUND OF THE INVENTION

This invention relates generally to electrical monitoring circuitry and more particularly, it relates to a wrist-strap monitoring system for monitoring continuously impedance of a human body via a wrist-strap connection worn on an operator's hand.

As is generally well-known in the electronic industry, there exists a wrist-strap which is a piece of wire worn by an operator so as to connect the operator to ground through a suitable resistance (i.e., one megaohm). In this manner, the build-up of electrostatic charge on the human body is prevented by attaching the human body to earth via the wrist-strap in order to drain off the charge before a problem occurs.

For example, an operator working in the manufacturing and assembling of semiconductor integrated circuits can develop an undesirable level of electrostatic charge in which the highly sensitive semiconductor integrated circuits may be damaged or destroyed when the potential is discharged. Therefore, it would be desirable to be able to monitor or detect that the wrist-strap is being worn by the operator so as to indicate a connection to ground. Further, it would be expedient to be able to detect when the ground connection is broken and to have a visual and/or audible indication of such condition. In addition, it would be further expedient to monitor continuously the impedance of a human body to be between an upper level and a lower level.

SUMMARY OF THE INVENTION

Accordingly, it is a general object of the present invention to provide a wrist-strap monitoring system which is relatively simple in its construction and is easy to manufacture and assemble.

It is an object of the present invention to provide a wrist-strap monitoring system for monitoring continuously grounding of a wrist-strap worn on an operator's hand.

It is another object of the present invention to provide a wrist-strap monitoring system for monitoring continuously the impedance of a human body to be between an upper level and a lower level.

It is still another object of the present invention to provide a wrist-strap monitoring system which includes a pair of wrist-straps each being worn by a different operator, wrist-strap monitoring circuitry for each wrist-strap, and logic/alarm indication circuitry.

In accordance with a preferred embodiment of the present invention, there is provided a wrist-strap monitoring system which includes a first wrist-strap monitoring circuitry and a second wrist-strap monitoring circuitry. The first wrist-strap monitoring circuitry is operatively connected to a first wrist-strap connection for monitoring continuously impedance of a first human body to be between an upper level and a lower level and for generating a first output signal when the impedance is above the upper level, and for generating a second output signal when the impedance is below the lower level. The second wrist-strap monitoring circuitry is operatively connected to a second wrist-strap connection for monitoring continuously impedance of a second human body to be between the upper level and the lower level, for generating a third output signal when the impedance is above the upper level, and for generating a fourth output signal when the impedance is below the lower level.

A logic circuitry is provided which is responsive to the first and second output signals from the first wrist-strap monitoring circuitry and to the third and fourth output signals from the second wrist-strap monitoring circuitry for generating an alarm signal. A sound device is responsive to the alarm signal for generating an audible signal.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
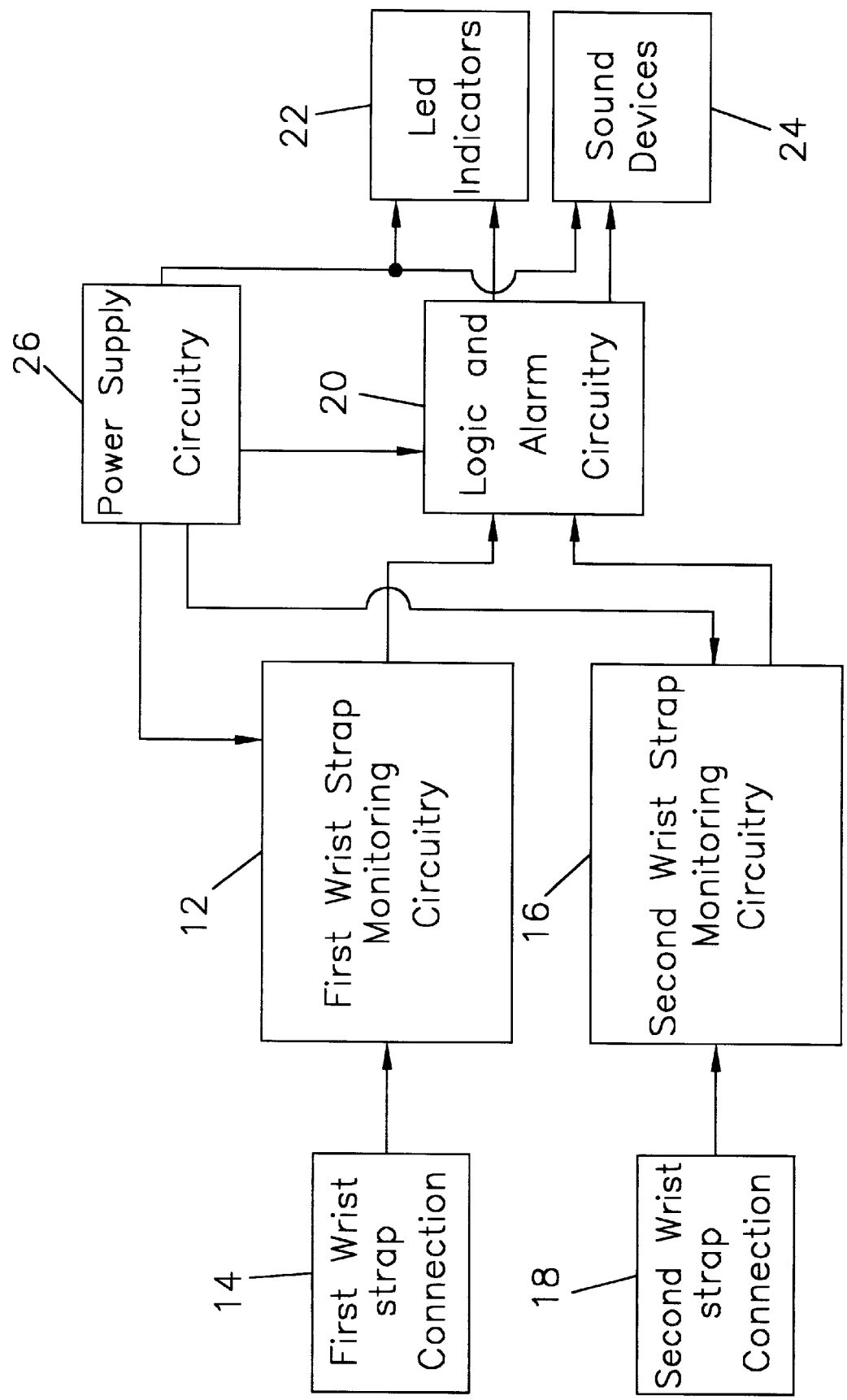
FIG. 1 is an overall, block diagram of a wrist-strap monitoring system, constructed in accordance with the principles of the present invention.

Referring now in detail to the drawings, there is shown in FIG. 1 an overall block diagram of a wrist-strap monitoring system 10, constructed in accordance with the principles of the present invention. This block diagram is utilized to show in a simplified form the respective portions of the system. Of course, it should be understood by those skilled in the art that the specific interconnections between the several components of the system are not shown in detail.

In particular, the monitoring system 10 is comprised of a first wrist-strap monitoring circuitry 12 having its input connected electrically to a first wrist-strap connection 14 and a second wrist-strap monitoring circuitry 16 having its input connected electrically to a second wrist-strap connection 18. Each of the first and second wrist-strap connections 14 and 18 is connectable to the wrists of different individual users or operators (not shown) and is connected to the respective monitoring circuits to determine if the corresponding operators have been properly grounded. A logic and alarm circuitry 20 has its inputs connected to the outputs of the first and second wrist-strap monitoring circuitry 12 and 16. If one of the monitoring circuitry detects that a wrist strap connection is not grounded, then the logic and alarm circuitry 20 will cause activation of a visual indicator such as light-emitting diode (LED) indicators 22 and will also trigger a sound device 24 such as a buzzer or beeper so as to alert personnel in the area of the situation. A power supply circuitry 26 is provided which supplies the necessary voltages to drive the circuitry 12, 16, and 20 as well as the visual and sound indicators 22, 24.

Figure 2:
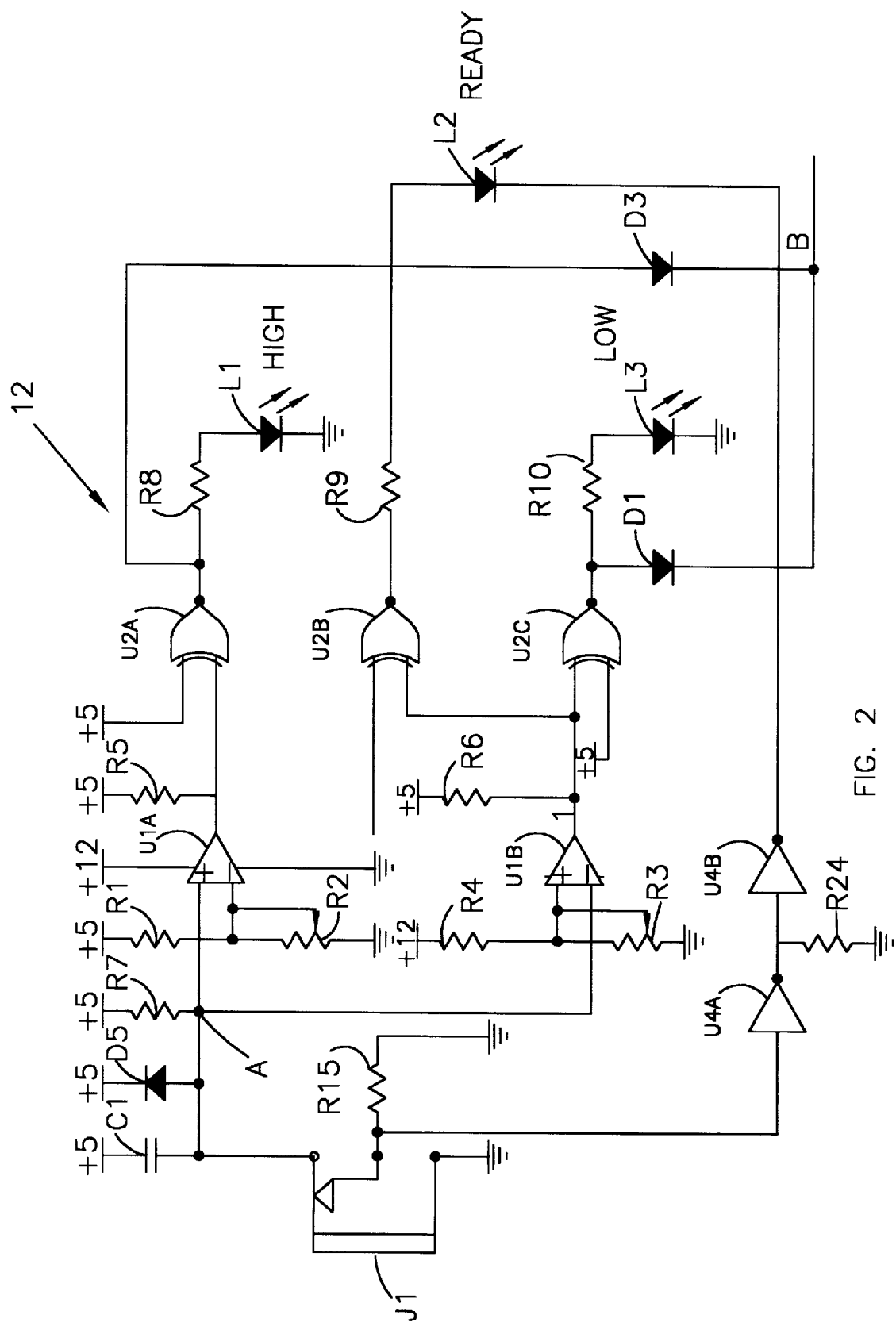
FIG. 2 is a detailed schematic circuit diagram of one of the wrist-strap monitoring circuitry blocks of FIG. 1.

Since the first and second wrist-strap monitoring circuitry 12 and 16 are identical in their construction and operation, it will be sufficient to illustrate and describe in detail the circuit components and their interconnection and operation of only one of them. Thus, there is shown in FIG. 2 a schematic circuit diagram of the first wrist-strap monitoring circuitry 12 of FIG. 1. The monitoring circuitry 12 includes a wrist-strap jack J1 which can be suitably affixed to a wrist-strap cord (not shown) to be worn by the user or operator. When the jack J1 is operatively connected to the operator, the operator's skin resistance which is normally between 1 Megaohm and 24 Megaohm will be coupled to the input of the monitoring circuitry.

The monitoring circuitry 12 includes a first comparator U1A, a second comparator U1B, a first exclusive OR logic gate U2A, a second exclusive OR logic gate U2C, a third exclusive OR logic gate U2B, and light-emitting diodes L1–L3. The first comparator U1A is preferably a LM339 I.C. chip or other suitable commercially available part. A voltage divider formed by a resistor R1 and a potentiometer R2 is connected between a first power supply voltage of +6 V and a ground potential. The wiper arm of the potentiometer R2 is connected to the minus (−) input (pin 4) of the comparator U1A and provides a means for setting the trip point corresponding to a high impedance of the operator (i.e., greater than 24 Megaohm) and for adjusting the trip point setting due to variations caused by input offset current of the comparator U1A. Typically, the voltage at the minus (−)input will be approximately +4.5 V. The plus (+) input (pin 5) of the comparator U1A is connected to a node A and is also coupled to the impedance of the operator via the jack J1. The output (pin 2) of the comparator U1A is coupled to the first power supply voltage of +6 V via a resistor R5. The output of the comparator U1A is also connected to a first input (pin 2) of the first exclusive OR logic gate U2A and to a first input of the third exclusive OR logic gate U2B. The output of the first exclusive OR logic gate U2A is coupled to the anode of the "High" LED L1 via a resistor R8. The cathode of the LED L1 is connected to the ground potential.

Similarly, the second comparator U1B is preferably a LM339 I.C. chip or other suitable commercially available part. A voltage divider formed by a resistor R4 and a potentiometer R3 is connected between a second power supply voltage of +12 V and the ground potential. The wiper arm of the potentiometer R3 is connected to the plus (+) input (pin 7) of the comparator U1B and provides a means for adjusting the trip point setting corresponding to a low impedance of the operator (i.e., below 1 megaohm) and for adjusting the same due to offset compensation. Typically, the voltage at the plus (+) input will be approximately +2.5 V. The minus (−)input (pin 6) of the comparator U1B is also connected to the node A and the impedance of the operator. The output (pin 1) of the comparator U1B is coupled to the first power supply voltage of +6 V via a resistor R6. The output of the comparator U1B is also connected to a first input of the second exclusive OR logic gate U2C and to a second input of the third exclusive OR logic gate U2B. The output of the second exclusive OR logic gate U2C is coupled to the anode of the LED L3 via a resistor R10. The cathode of the "Low" LED L3 is connected to the ground potential.

The first monitoring wrist-strap monitoring circuitry 12 further includes a first inverter U4A (4069) and a second inverter U4B. The first inverter U4A has its input coupled to the operator's impedance via the jack J1 and to one end of a resistor R15. The other end of the resistor R15 is connected to the ground potential. The input of the second inverter U4B is connected to the output of the first inverter U4A and to one end of a resistor R2. The other end of the resistor R2 is connected to the ground potential. The output (pin 4) of the third exclusive OR logic gate U2B is coupled to the anode of "Ready" LED L2 via a resistor R9. The output of the second inverter U4B is connected to the cathode of the LED L2. The outputs of the first and second exclusive OR logic gates U2A, U2C are coupled to a node B via respective diodes D3 and D1.

In normal operation when the user has affixed to his wrist the wrist strap cord so as to provide a good ground connection, the impedance added to the node A will be between 1 Megaohm to 24 Megaohm. As a result, the voltage at the output (pin 2) of the first comparator U1A will be at a high level. Also, the voltage at the output (pin 1) of the second comparator U1B will be at a high level. With both inputs to the first exclusive OR logic gate U2A being at the high levels, its output (pin 3) will be at a low logic level and will render the "High" LED L1 non-conductive. Further, with both inputs to the third exclusive OR logic gate U2C being at the high levels, its output (pin 10) will be at a low logic level and will render the "Low" LED L3 non-conductive. In addition, the input of the first inverter U4A will be at a low level and the output (pin 4) of the third exclusive OR logic gate will be at a high level so as to cause the "Ready" LED L2 to be lit, indicating a ready condition.

If the operator's impedance becomes greater than approximately 24 Megaohm, this will cause the output of the first comparator U1A to go to a low level. This will, in turn, cause the output of the first exclusive OR logic gate U2A to go to a high level, thereby turning on the "High" LED L1 to indicate a high impedance state. This same high signal will be applied to the node B via the diode D3. Concurrently, the output of the third exclusive OR logic gate U2B will go low so as to extinguish the "Ready" LED L2. Further, if the operator's impedance becomes less than 1 Megaohm, this will cause the output of the second comparator U2A to go to a low level. As a consequence, the output of the second exclusive OR logic gate U2C will go to a high level so as to render conductive the "Low" LED L3 to indicate a low impedance state. This same high signal will be applied to the node B via the diode D1. In addition, the output of the third exclusive OR logic gate U2B will again go low to turn off the "Ready" LED L2.

Figure 3:
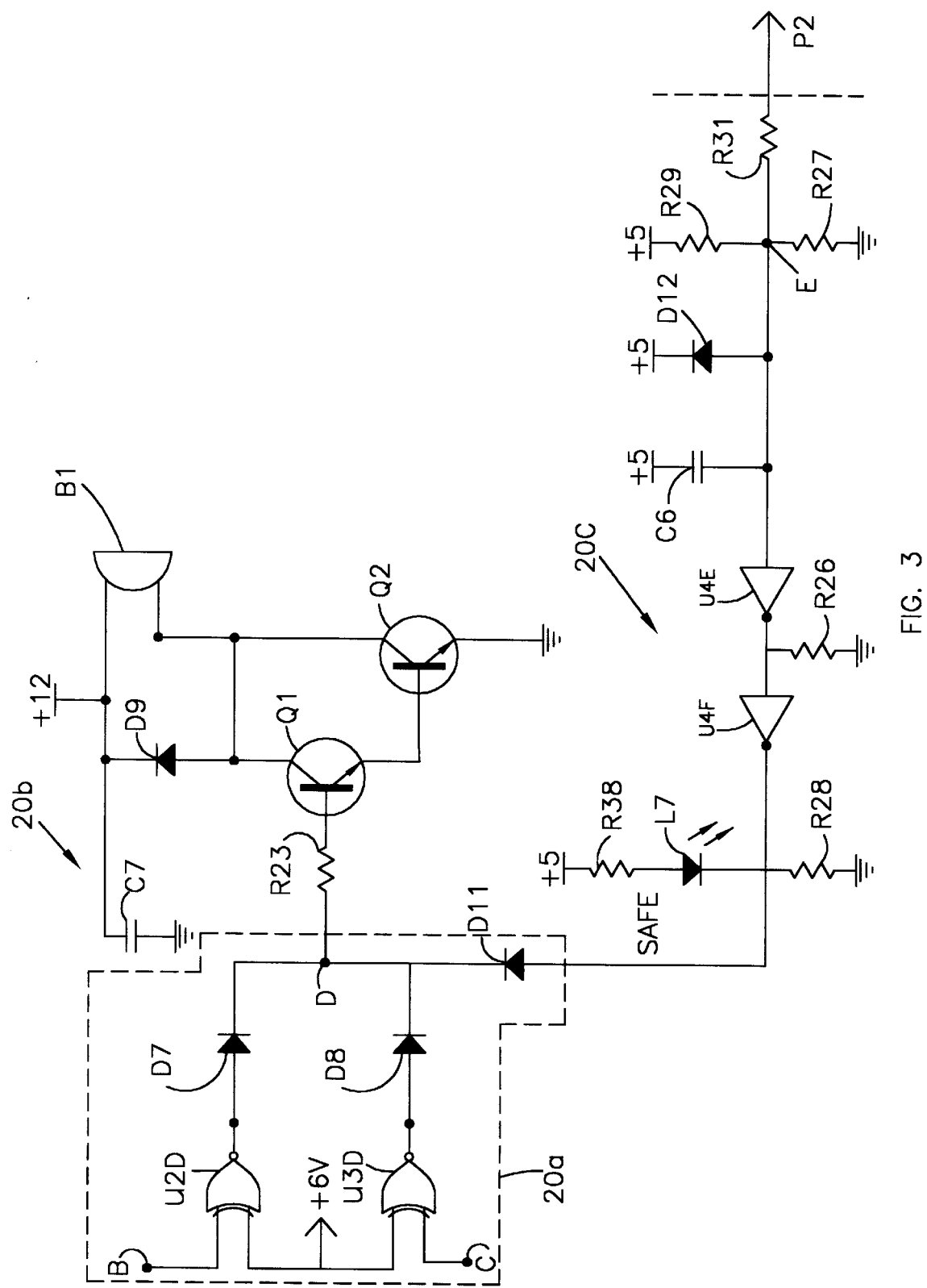
FIG. 3 is a detailed schematic circuit diagram of the logic and alarm circuitry block of FIG. 1.

Referring now to FIG. 3 of the drawings, there is shown a schematic circuit diagram of the logic and alarm circuitry 20 of FIG. 1. The logic portion 20a consists of a fourth exclusive OR logic gate U2B and a fifth exclusive OR logic gate U3D and diodes D7, D8. The fourth exclusive OR logic gate U2D has its first input connected to the output of the first wrist-strap monitoring circuitry 12 at the node B and its second input connected to the first power supply voltage of +6 V. The output of the fourth exclusive OR logic gate U2D is connected to the anode of the diode D7. Similarly, the fifth exclusive OR logic gate U3D has its first input connected to the output of the second wrist-strap monitoring circuitry 16 at a node C and its second input connected to the first power supply voltage of +6 V. The output of the fifth exclusive OR logic gate U3D is connected to the anode of the diode DB. The cathodes of the diodes D7, D8 are connected together and to a node D.

The alarm portion 20b consists of transistors Q1, Q2 (SC649), a diode D9, a resistor R23, a capacitor C7, and a beeper B1. The node D is coupled to the base of the transistor Q1 via the resistor R23. The transistors Q1 and Q2 are connected together in a Darlington configuration. The collectors of the transistors Q1 and Q2 are connected together, to the anode of the diode D9, and to one input of the beeper B1. The second power supply voltage of +12 V is connected to the other input of the beeper B1, the cathode of the diode D9, and one side of the capacitor C7. The other side of the capacitor C7 and the emitter of the transistor Q2 are connected to the ground potential.

The logic and alarm circuitry 20 further includes a ground detection portion 20c which is comprised of a plug P2; resistors R27–R31; diode D12; capacitor C6; inverters U4E, U4F; and a "Safe" LED L7. If the plug P2 is grounded, then the voltage at node E will be low so as to cause the output of the inverter U4F to be low. As a result, the "Safe" LED L7 will be lit so as to indicate a safe condition. In addition, the alarm portion 20b will be turned off since the voltage at the node D will be at a low level. On the other hand, when the plug P2 is ungrounded, the node E will go to a high level, and the output of the inverter U4F will be also high so as to extinguish the "Safe" LED L7. Further, this high level will cause the diode D11 to become forward-biased so as to cause a high level to appear at the node D. As a result, the alarm portion 20b will sound the beeper B1.

Figure 4:
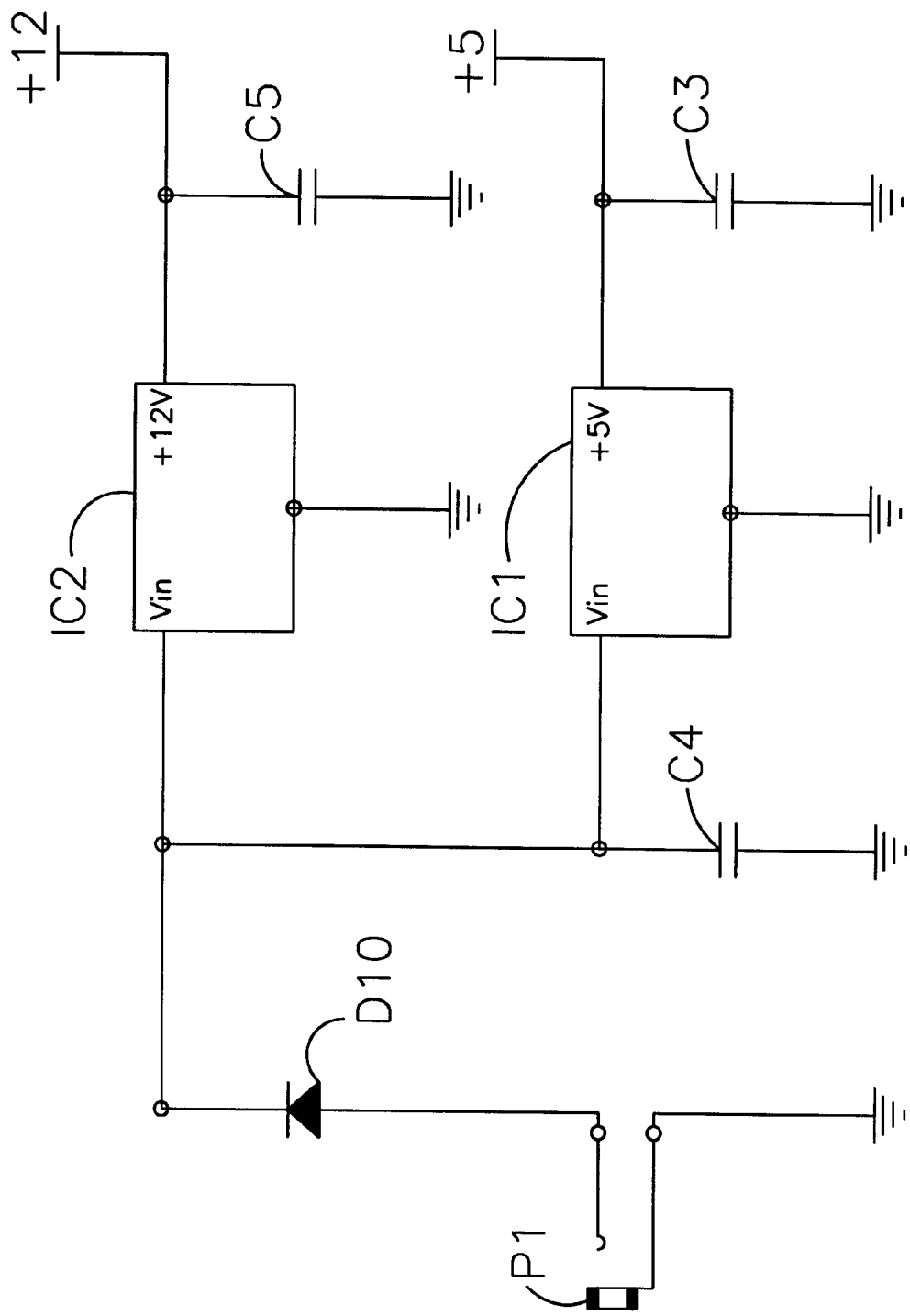
FIG. 4 is a detailed schematic circuit diagram of the power supply circuitry block of FIG. 1.

In FIG. 4, there is shown a schematic circuit diagram of the power supply circuitry 26 of FIG. 1. The power supply circuitry 26 includes a plug P1 which is connectable to an AC adaptor (not shown) for converting 110 VAC to a +12 V regulated DC signal. The power supply circuitry 26 includes a first regulator IC1 (LM7806CT) to regulate the DC signal to a regulated +6 VDC at its output (pin 3) and a second regulator IC2 (LM7812CT) to regulate the DC signal to a regulated +12 VDC at its output (pin 3). The +12 VDC from the plug P1 also is fed via the diode D10 to the inputs (pin 1) of the regulators IC1 and IC2. A filter capacitor C4 is connected between the +12 VDC and the ground potential. Also, filter capacitors C3 and C4 are connected between the respective outputs of the regulators and the ground potential.

Figure 5B:
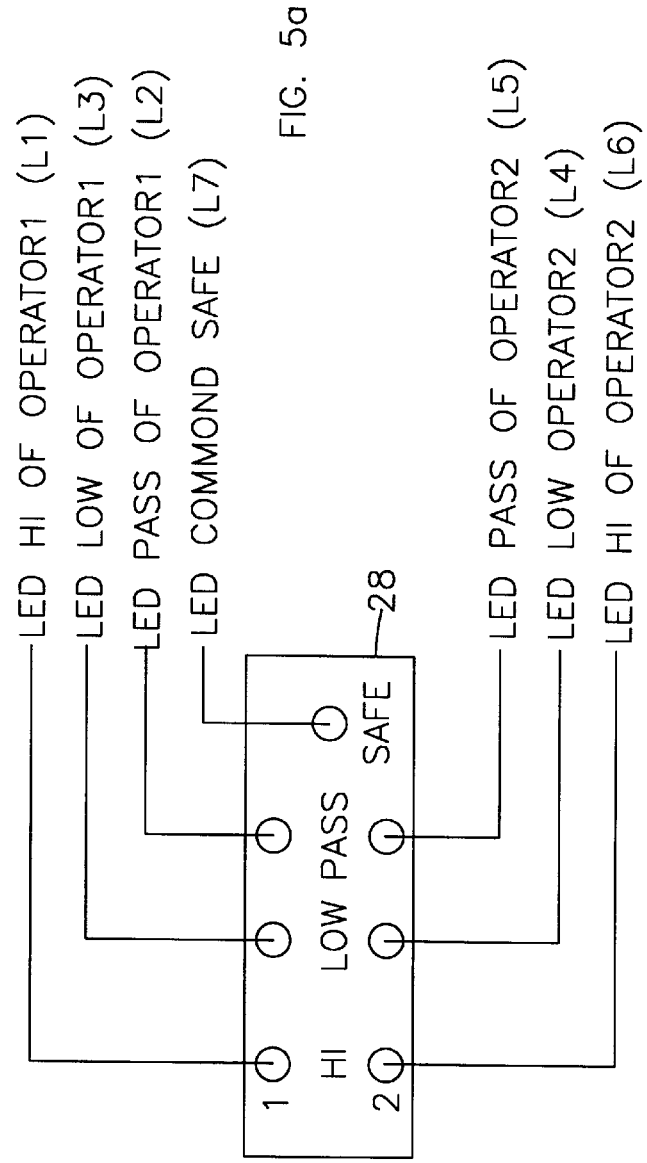
FIG. 5(b) is a back view of a panel on the enclosure.
Figure 5A:
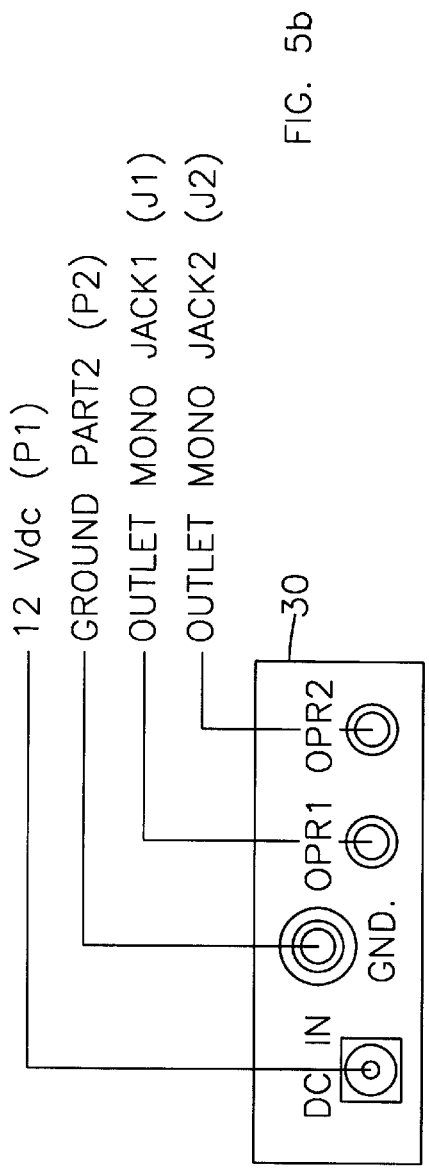
FIG. 5(a) is a front view of a panel on an enclosure housing the wrist-strap monitoring system.

In FIG. 5(a), there is depicted a front view of a panel 28 on an enclosure (not shown) housing the wrist-strap monitoring system 10 of FIG. 1. The LEDs L1, L3 and L2 are associated with the first wrist-strap monitoring circuitry 12, and the LEDs L6, L4 and L5 are associated with the second wrist-strap monitoring circuitry 16. The "Safe" LED L7 is associated with the ground detection portion 20c of the logic and alarm circuitry. In FIG. 5(b) there is depicted a back view of a panel 30 on the enclosure. The plug P1 is connected to the "DC INN" jack and the plug P2 is connected to the "GND" jack. The wrist-strap cord (not shown) of the first operator is connected to the "OPR1" jack and the wrist-strap cord of the second operator is connected to the "OPR2" jack.

From the foregoing detailed description, it can thus be seen that the present invention provides a wrist-strap monitoring system which includes wrist-strap monitoring circuitry for monitoring continuously impedance of a human body to be between an upper level and a lower level. Further, a ground detection circuit is used to monitor continuity of the ground connection. If the ground connection is broken (disconnected) or the impedance of the human body is either above the upper level or below the lower level, a logic and alarm circuitry will be activated so as to cause a visual indication and an audible signal.

What is claimed is:

1. A wrist-strap monitoring system comprising:
   first wrist-strap monitoring means, which is operatively connected to a first wrist-strap connection for continuously monitoring impedance of a first human body to be between an upper impedance level and a lower impedance level, for generating a first high-impedance output signal when the impedance is above the upper impedance level and for generating a second low-impedance output signal when the impedance is below the lower impedance level;
   second wrist-strap monitoring means, which is operatively connected to a second wrist-strap connection for continuously monitoring impedance of a second human body to be between the upper level and the lower level, for generating a third high-impedance output signal when the impedance is above the upper impedance level, and for generating a fourth low-impedance output signal when the impedance is below the lower impedance level;
   logic circuit means, responsive to said first and second output signals from said first wrist-strap monitoring means and to said third and fourth output signals from said second wrist-strap monitoring means, for generating an alarm signal, wherein said logic circuit means is comprised of a pair of first and second exclusive OR logic gates, wherein said first exclusive OR logic gate has its inputs coupled to receive said first high-impedance output signal and said second low-impedance output signal, and wherein said second exclusive OR logic gate has its inputs coupled to receive said third high-impedance output signal and said fourth low-impedance output signal;
   visual indicating means, including a plurality of light-emitting diodes, each of which is respectively responsive to one of said first through fourth output signals, for generating separate visual signals for each of the first through fourth output signals, wherein one of said plurality of light-emitting diodes indicates when the impedance of the first human body is above the upper impedance level, wherein another of said plurality of light-emitting diodes indicates when the impedance of the first human body is below the lower impedance level, wherein yet another of said plurality of light-emitting diodes indicates when the impedance of the second human body is above the upper level, and wherein still another of said plurality of light-emitting diodes indicates when the impedance of the second human body is below the lower level;
   sound means responsive to said alarm signal for generating an audible signal; and
   ground detection means operatively connected to a ground connection for monitoring continuity of the ground connection and for generating an ungrounded signal when there is no continuity, wherein said sound means is also responsive to said ungrounded signal for generating the audible signal.

2. A wrist-strap monitoring system as claimed in claim 1, wherein said sound means includes a beeper which is used to generate said audible signal.

3. A wrist-strap monitoring system as claimed in claim 1, wherein said upper level of the impedance is approximately 24 Megaohm.

4. A wrist-strap monitoring system as claimed in claim 3, wherein said lower level of the impedance is approximately 1 Megaohm.

5. A wrist-strap monitoring system comprising:
   wrist-strap monitoring means operatively connected to a wrist-strap connection for continuously monitoring impedance of a human body to be between an upper impedance level and a lower impedance level, for generating a first output signal when the impedance is above the upper impedance level, and for generating a second signal when the impedance is below the lower impedance level;

logic circuit means responsive to said first and second output signals from said wrist-strap monitoring means and for generating an alarm signal wherein said logic circuit means is comprised of an exclusive OR logic gate, said exclusive OR logic gate having its inputs coupled to receive said first and second output signals;

visual indicating means, including a first light-emitting diode which is responsive to said first output signal for indicating when the impedance of the human body is above the upper impedance level and a second light-emitting diode which is responsive to said second output signals for indicating when the impedance of the human body is below the lower impedance level;

sound means responsive to said alarm signal for generating an audible signal; and ground detection means operatively connected to a ground connection for monitoring continuity of the ground connection and for generating an ungrounded signal when there is no continuity, wherein said sound means is also responsive to said ungrounded signal for generating the audible signal.

6. A wrist-strap monitoring system as claimed in claim 5, wherein said sound means includes a beeper which is used to generate said audible signal.

7. A wrist-strap monitoring system as claimed in claim 5, wherein said upper level of the impedance is approximately 24 Megaohm.

8. A wrist-strap monitoring system as claimed in claim 7, wherein said lower level of the impedance is approximately 1 Megaohm.

* * * * *